United States Patent
Inoue et al.

(10) Patent No.: US 6,962,161 B2
(45) Date of Patent: Nov. 8, 2005

(54) METHOD OF HIGH PRESSURE TREATMENT

(75) Inventors: Yoichi Inoue, Hyogo (JP); Kaoru Masuda, Hyogo (JP); Katsuyuki Iijima, Hyogo (JP)

(73) Assignee: Kobe Steel, Ltd., Kobe (JP)

( * ) Notice: Subject to any disclaimer, the term of this patent is extended or adjusted under 35 U.S.C. 154(b) by 14 days.

(21) Appl. No.: 10/472,498

(22) PCT Filed: Nov. 21, 2002

(86) PCT No.: PCT/JP02/12149

§ 371 (c)(1),
(2), (4) Date: Oct. 1, 2003

(87) PCT Pub. No.: WO03/049167

PCT Pub. Date: Jun. 12, 2003

(65) Prior Publication Data

US 2004/0103922 A1 Jun. 3, 2004

(30) Foreign Application Priority Data

Dec. 3, 2001 (JP) .................... 2001-369115

(51) Int. Cl.⁷ ............................... B08B 3/04
(52) U.S. Cl. .................. 134/634; 134/2; 134/26; 134/30; 134/35; 134/36; 134/42; 134/902
(58) Field of Search ................ 134/2, 26, 30, 134/34, 35, 36, 42, 902

(56) References Cited

U.S. PATENT DOCUMENTS

| 6,277,753 | B1 | * | 8/2001 | Mullee et al. ............... 438/692 |
| 2002/0014257 | A1 | * | 2/2002 | Chandra et al. .............. 134/19 |
| 2002/0088477 | A1 | | 7/2002 | Cotte et al. |
| 2003/0125225 | A1 | * | 7/2003 | Xu et al. ..................... 510/175 |
| 2003/0217764 | A1 | * | 11/2003 | Masuda et al. ............... 134/26 |
| 2004/0011386 | A1 | * | 1/2004 | Seghal ........................ 134/26 |
| 2004/0087456 | A1 | * | 5/2004 | Korzenski et al. .......... 510/175 |
| 2004/0198627 | A1 | * | 10/2004 | Masuda et al. .............. 510/412 |

FOREIGN PATENT DOCUMENTS

| JP | 11-087306 | 3/1999 |
| JP | 2002-336675 | 11/2002 |
| JP | 2002-353185 | 12/2002 |
| JP | 2002-367943 | 12/2002 |
| JP | 2003-031547 | 1/2003 |

* cited by examiner

Primary Examiner—Sharidan Carrillo
(74) Attorney, Agent, or Firm—Oblon, Spivak, McClelland, Maier & Neustadt, P.C.

(57) ABSTRACT

In a high pressure processing method for removing an unnecessary substrate on the surface of the surface of a workpiece by bringing it into contact with supercritical carbon dioxide and additives in a high-pressure chamber, removing the unnecessary substance on the workpiece, first rinsing and second rinsing are performed under a substantially same pressure with continuous flowing of supercritical carbon dioxide.

12 Claims, 2 Drawing Sheets

001920  20.0kV  ×20.0K   1.50μm 000016  20.0kV  ×20.0K   1.50μm

METHOD OF HIGH PRESSURE TREATMENT

TECHNICAL FIELD

The present invention relates to a method of efficiently cleaning, developing or drying a workpiece that has fine structure (micro-structured surface) on their surface of such as a semiconductor substrate (wafer), for instance, a method of removing unnecessary materials such as resist and so on stuck onto a surface of a substrate in a semiconductor manufacturing process off the substrate and removing therefrom.

BACKGROUND ART

In the field of semiconductor devices, formation of fine patterns has been rapidly developed. The size of wiring in a device was substantially 1 $\mu$m about 10 years ago, it is substantially 0.18 $\mu$m at the present time, and furthermore, devices having a wiring size of 0.13 $\mu$m have almost come into practical use. Further, researches and developments to manufacture semiconductor devices having a wiring size from 0.10 $\mu$m to 0.07 $\mu$m, or even of 0.05 $\mu$m have been started.

Furthermore, along with a higher speed of the semiconductor device, introduction of new materials is vigorously in study. For instance, as insulator, low dielectric constant (low-k) materials attract increasing attention, and the possibility that porous materials of organic materials and organic/inorganic composite materials are used for low-k materials and how to reduce the dielectric constant are recently actively studied. The development of such semiconductor devices causes various problems that have not been problematic so far.

For instance, in a cleaning process that is an important process in the manufacturing process of the semiconductors, so far, as a cleaning method of semiconductor wafers, a wet cleaning method in which a semiconductor is cleansed with a solution in which necessary additives are added to ultra pure water has been adopted. After the cleaning, it is general to rinse the wafer with ultra-pure water, followed by applying spin dryer in which the wafer is rotated to spin off water. As the additives, amine-based compounds or fluorinated compounds have been selected in accordance with applications.

However, with the miniaturization of semiconductor devices and the application of new materials, there have been caused problems by using the water-based cleaning method. One of them is in that since the water-based cleaning agent cannot permeate into fine via holes of a diameter of substantially 0.1 $\mu$m, the cleaning cannot be thoroughly performed. Though difference in the extent of permeation depends on the diameter of via hole and material, it is considered that the more the via hole is miniaturized, the more difficult the cleaning becomes owing to physical properties such as the interfacial tension and viscosity that liquid intrinsically has.

Furthermore, in the case of the porous new materials that have a lot of holes further finer than via hole, there have been the other problem that it is difficult to remove the cleaning liquid inside of the fine hole even if the cleaning liquid has permiated into the fine hole.

When water remains on a surface of a semiconductor wafer, various kinds of inconveniences are caused in later processes; accordingly, drying after the cleaning is important. In this connection, along with the miniaturization of the devices, occurrence of traces called watermark that remains after water is dried is also problematic. Furthermore, consuming a lot of precious water resource in the cleaning process cannot be said appropriate from a viewpoint of protection of the environment.

Similar problems have occurred also in the development process of the semiconductor wafers. In the development process of the semiconductor wafers, exposed resist material is developed with an aqueous solution of TMAH (tetramethyl ammonium hydroxide). The development process is followed by rinsing with ultra pure water further followed by drying by means of spin-dry. Accordingly, there are similar problems as in the cleaning process of the wafers. Furthermore, there is a problem that the projected portions of the pattern are destroyed by the capillary force generated in a gas-liquid interface and so on because a fine resist pattern is not such tough.

In order to solve the problems, recently, supercritical fluid has been studied to use for cleaning and as a rinse liquid. A supercritical state means a state above the critical temperature and critical pressure intrinsic to a substance; it is a fourth state of a substance that is neither solid, nor liquid, nor gas; in the supercritical liquid, particularly, intermediate properties of the liquid and the gas strongly appear. For instance, the density of the supercritical fluid is close to that of the liquid; however the viscosity and diffusion coefficient are close to that of the gas. Accordingly, the supercritical fluid has the density close to the liquid on one hand, and has movability and penetrating ability close to that of the gas on the other hand.

Industrially, carbon dioxide is most frequently used as the supercritical fluid; this is because its critical pressure is low such as 7.3 MPa, its critical temperature is close to room temperature such as 31 degree centigrade, and it is nonflammable, inexpensive and harmless. Supercritical carbon dioxide has many excellent properties as a fluid that can be used in place of water in the cleaning process of the semiconductor devices.

First, the supercritical carbon dioxide can easily penetrate into the via holes and fine pores of the porous material and can be easily removed therefrom. Accordingly, the difficulty in the cleaning accompanying the miniaturization of the device can be solved. In the next place, the supercritical carbon dioxide, having the density close to that of the liquid as mentioned above, can contain a large quantity of a additives and a co-solvent; in other words, it means that the supercritical carbon dioxide has cleaning ability comparable to ordinary liquids. Still furthermore, since there is no need of using water in the cleaning process, all of the aforementioned problems such as the problem of remaining water, the problem of the watermark in the cleaning process, the problem of pattern destruction due to the interfacial tension and the problem of environmental destruction can be overcome by use of the supercritical carbon dioxide.

In this connection, the present invention intends to provide the most preferable method when substances to be processed such as semiconductor wafers are processed with supercritical carbon dioxide.

DISCLOSURE OF THE INVENTION

A method according to the present invention is a high-pressure processing method for removing an unnecessary substance on the surface of a workpiece by bringing the surface of the workpiece into contact with supercritical carbon dioxide and additives in a high-pressure processing chamber, said method comprising the steps of:

sealing said high-pressure processing chamber after loading said workpiece in said high-pressure processing chamber;

pressurizing said high-pressure processing chamber with pressurized carbon dioxide supplied to said high-pressure processing chamber to a predetermined pressure and a predetermined temperature higher than the critical pressure and critical temperature thereof respectively;

dissolving said additives and a co-solvent in supercritical carbon dioxide by mixing said additives and said co-solvent with said supercritical carbon dioxide in the upstream of said high-pressure processing chamber;

removing an unnecessary substance on said workpiece while maintaining the inside of said high-pressure processing chamber higher than the critical pressure and critical temperature of carbon dioxide, by supplying continuously a predetermined amount of a mixture fluid of said additives, said co-solvent and said supercritical carbon dioxide to said high-pressure processing and ejecting a substantially equal amount of the high-pressure fluid to the predetermined supply amount from said high-pressure processing chamber;

obtaining a first rinse fluid in which said co-solvent is dissolved in said supercritical carbon dioxide, by stopping feed of said additives and mixing said co-solvent with said supercritical carbon dioxide in the upstream of said high-pressure processing chamber;

performing a first rinsing process for replacing the mixture fluid of said additives, said co-solvent and said supercritical carbon dioxide in said high-pressure processing chamber with said first rinse fluid while maintaining the inside of said high-pressure processing chamber higher than the critical pressure and critical temperature of carbon dioxide, by supplying continuously a predetermined amount of said first rinse fluid to said high-pressure processing chamber and ejecting a substantially equal amount of the high-pressure fluid to the predetermined supply amount from said high-pressure processing chamber;

performing a second rinsing process for replacing said first rinse fluid in said high-pressure processing chamber with said supercritical carbon dioxide while maintaining the inside of said high-pressure processing chamber higher than the critical pressure and critical temperature of carbon dioxide, by stopping supply of said co-solvent, supplying continuously only supercritical carbon dioxide by a predetermined amount to said high-pressure processing chamber and ejecting a substantially equal amount of the high-pressure fluid to the predetermined supply amount from the high-pressure processing chamber;

stopping feed of carbon dioxide to said high-temperature processing chamber;

decompressing said high-pressure processing chamber to atmospheric pressure; and unloading said workpiece from said high-pressure processing chamber.

According to the method, supercritical carbon dioxide is continuously supplied to the high-pressure processing chamber, and a supply amount and an exhaustion amount thereof are set substantially equal; accordingly, a pressure in the high-pressure processing chamber can be maintained constant. As a result, there is no loss in the time of each process of removing unnecessary materials and the first and second rinse processes; that is, a whole process can be carried out in a short period of time. Furthermore, the high-pressure processing can be performed under stable and uniform conditions with excellent reproducibility.

BEST MODE FOR CARRYING OUT THE INVENTION

As a high-pressure processing in a high-pressure processing method according to the invention, a typical example can be a cleaning process in which from a workpiece thereto unnecessary materials stick such as semiconductor substrates thereto resist and residue stick after, for instance, the etching, the unnecessary materials are peeled off and removed. Furthermore, without restricting to the cleaning, all processes (for instance, drying, development and so on) in which unnecessary materials are removed from on the workpiece with supercritical carbon dioxide and additives can be included in the high-pressure processing method according to the invention.

Figure 1:
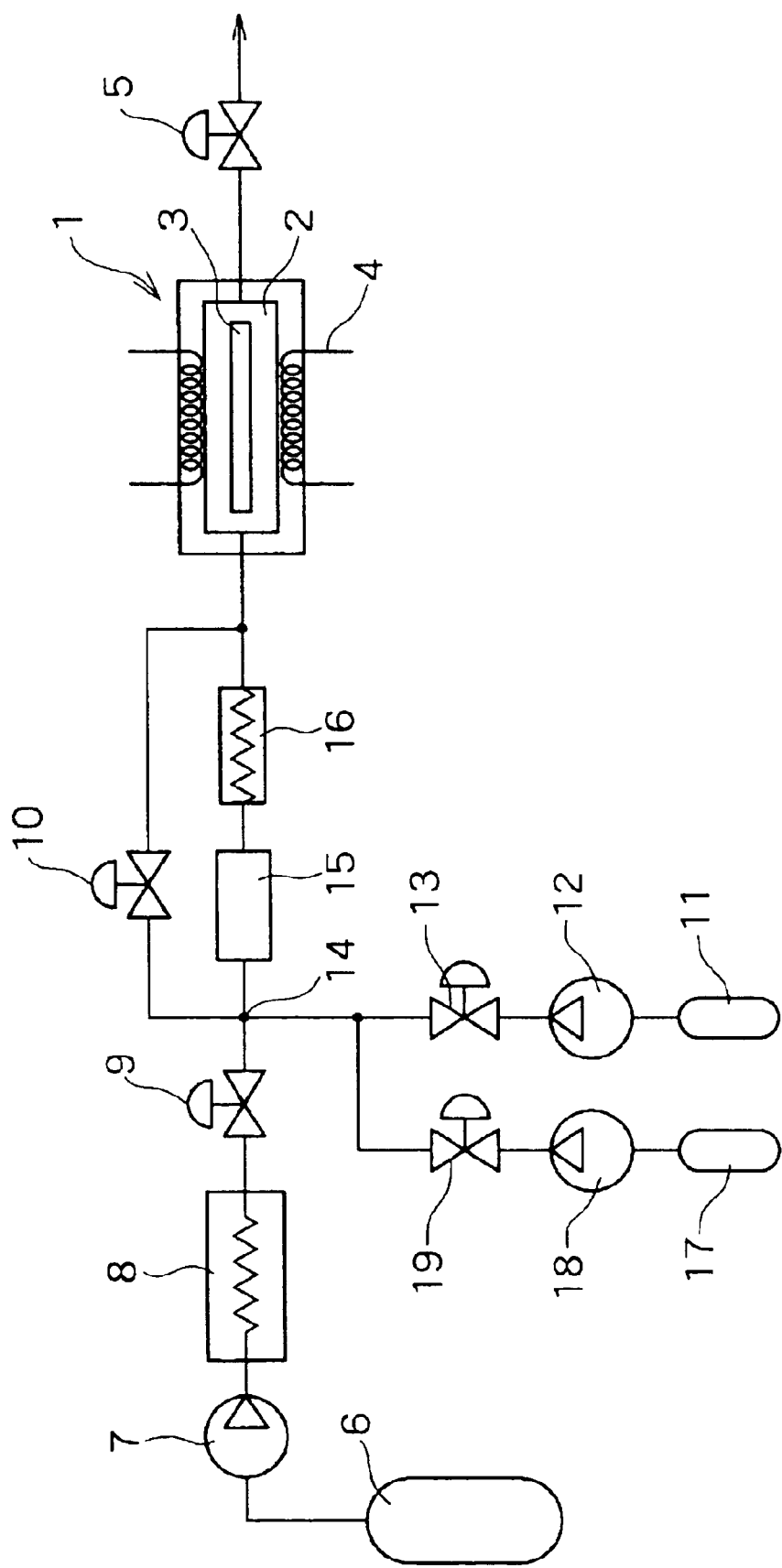
FIG. 1 is an explanatory diagram showing an example of a high-pressure equipment for carrying out an invention method.

In the following, the high-pressure processing method according to the invention will be explained with reference to the drawings. In FIG. 1, an example of a high-pressure processor for carrying out the invention method is shown. Inside of a high-pressure vessel 1, a high-pressure processing chamber 2 is partitioned and therein a workpiece 3 such as a wafer or the like is processed. On a wall surface of the high-pressure vessel 1, temperature control means 4 are disposed to control a temperature inside of the high-pressure processing chamber 2. The high-pressure vessel 1 is constituted freely openable so that the workpiece 3 may be put in and taken out.

A first stage according to the invention method includes, after inserting the workpiece 3 into the high-pressure processing chamber 2, closing the high-pressure vessel 1, and hermetically sealing the high-pressure processing chamber 2. A high-pressure valve 5 is also closed. The inside of the high-pressure processing chamber 2 is preferably heated by use of temperature control means 4.

A second stage includes supplying pressurized carbon dioxide to the high-pressure processing chamber 2, and pressurizing the carbon dioxide in the high-pressure processing chamber 2 to a supercritical state of a predetermined temperature and predetermined pressure equal to or more than the critical temperature and critical pressure thereof. Carbon dioxide is reserved in a liquid carbon dioxide cylinder 6 and pressurized to a necessary pressure by a pressure pump 7. Pressurized carbon dioxide is heated, by means of a heater 8, to a predetermined temperature equal to or more than the critical temperature. High-pressure valves 9 and 10 are opened, and thereby pressurized and heated carbon dioxide is supplied to the high-pressure processing chamber 2. Supplying carbon dioxide to the high-pressure processing chamber 2, a pressure inside of the high-pressure processing chamber 2 is raised; accordingly, the supply of carbon dioxide to the high-pressure processing chamber 2 is continued until a predetermined processing pressure equal to or more than the critical pressure. The high-pressure processing chamber 2 is maintained at a predetermined temperature by use of temperature control means 4 provided to the high-pressure vessel 1. As the temperature control means 4, various known means such as a heating wire or passing of a thermal catalyst can be adopted.

Going through the second stage, supercritical carbon dioxide of the predetermined temperature and pressure is filled inside of the high-pressure processing chamber 2. The temperature and pressure at this time, though appropriately varied according to the workpiece and kinds of the unnecessary materials to be removed, are preferably in the ranges of from 35 to 70 degree centigrade and from 10 to 20 MPa, respectively.

In a third stage, high-pressure processing such as cleaning and so on is performed. The third stage includes mixing and dissolving the additives, the co-solvent and carbon dioxide; and processing such as the cleaning and the like. First, when the second stage has come to completion, the high-pressure valve 10 is closed, and the high-pressure valves 5 and 13 are opened. Furthermore, from a additives and co-solvent storage tank 11 that reserves the additives and co-solvent, by use of a pump 12, a mixture of the additives and co-solvent is allowed to merge into a carbon dioxide supply line (merging point 14). Subsequently, by going through mixing unit 15, the additives and co-solvent are dissolved in carbon dioxide, and thereby a homogenous dissolution state can be obtained. This is the mixing and dissolving process. The mixture, if necessary, is heated again by a heater 16 and supplied to the high-pressure processing chamber 2. The heater 16 is used when owing to mixing of the additives and co-solvent, a temperature of carbon dioxide is lowered and thereby the supercritical state disappears.

Subsequently, the high-pressure processing such as cleaning and so on is carried out. When the mixture fluid of carbon dioxide, additives and co-solvent is supplied to the high-pressure processing chamber 2, the high-pressure valve 5 is controlled so that a pressure in the high-pressure processing chamber 2 is a pressure same as that of the second stage. Specifically, the high-pressure fluid of an amount substantially same as that of the mixture fluid supplied into the high-pressure processing chamber 2 is extracted from the high-pressure processing chamber 2, and thereby a pressure in the high-pressure processing chamber 2 is maintained at a constant value.

As the third stage is continuously carried out, supercritical carbon dioxide therein the additives and the co-solvent are homogemeously mixed and dissolved is supplied constantly in a clean state to the high-pressure processing chamber 2 and comes into contact with a surface of the workpiece 3 such as wafers. Then, unnecessary materials are dissolved from a surface of the workpiece 3 into a cleaning fluid and removed. The high-pressure fluid that is contaminated by dissolving the unnecessary materials, without remaining in the high-pressure processing chamber 2, is exhausted from the high-pressure processing chamber 2. Accordingly, the third stage that performs the cleaning and so on can be carried out stably and in a short period of time.

Here, as the additives, fluorides can be preferably used in order to remove also polymer contaminants such as resist and etching polymer stuck to a semiconductor substrate. Fluorides very thinly dissolve a surface of the workpiece 3, and, owing to a lift off effect, unnecessary materials on a surface of the workpiece 3 are excellently removed.

As specific examples of the fluoride, ammonium fluoride ($NH_4F$), quaternary ammonium fluorides containing nitrogen atom and hydrogen atom such as tetramethylammonium fluoride, tetraethylammonium fluoride, tetrapropylammonium fluoride, tetrabutylammonium fluoride, and choline fluoride $[HOCH_2CH_2N(CH_3)_3]^+F^-$ can be cited. The fluorides have excellent cleaning power. Depending on the kind of the workpiece, fluorides further containing carbon atom (for instance, among the above cited compounds, compounds other than ammonium fluoride) are more effective. Polyalcohols such as polypropylene glycol may be used as the additives together with the fluorides.

Depending on the kind of the workpiece and the kind of the unnecessary material, the kind of the additives may be altered; quaternary ammonium hydroxides such as TMAH (tetramethylammonium hydroxide), alkylamines, alkanolamines, hydroxylamines ($NH_2OH$), xylenes, methylisobutyl ketones and fluorinated polymers may be used as the additives.

The additives can be dissolved with difficulty in supercritical carbon dioxide; accordingly, by using in combination a co-solvent that can be a dissolution auxiliary, a homogeneous cleaning fluid (mixture fluid of the additives, the co-solvent and carbon dioxide) can be obtained. Although the co-solvents are not restricted to particular ones as far as the additives and supercritical carbon dioxide are made compatible, aliphatic alcohols, in particular, aliphatic alcohols having one to three carbons such as methanol, ethanol, isopropanol and so on can be preferably cited. This is because that these substances dissolve easily in supercritical carbon dioxide; accordingly, by controlling an addition amount thereof, the cleaning power can be controlled. One kind or two or more kinds thereof may be mixed and used.

The additives and the co-solvent can be supplied through separate supply lines to a carbon dioxide supply line; however, it is preferable that the additives and the co-solvent are mixed in advance and supplied to carbon dioxide. Furthermore, it is also preferable mode to dispose mixing unit 15 between the merging point 14 and the high-pressure processing chamber 2, and thereby uniformly dissolving the mixture of the additives and the co-solvent and carbon dioxide. In the case where the additives or the co-solvent is not uniformly dissolved in carbon dioxide, the additives and co-solvent are contained as fine droplets in carbon dioxide. When such droplets come into contact with a surface of the workpiece 3, there are concerns in that troubles such as the workpiece 3 being locally destroyed and the processing such as the cleaning being nonuniformly applied might be caused. Accordingly, these three components are preferable to be mixed and dissolved homogenously.

As means 15 for mixing, means in which a pipeline agitator controls flow directions of carbon dioxide, additives and co-solvent and merges these, for instance, so-called static mixer can be conveniently used; however, known agitators can be used.

In the third stage, when a total amount of the mixture fluid of the additives, co-solvent and carbon dioxide is set at 100 mass percent, a ratio of a total amount of the additives and co-solvent, that is, (the additives+co-solvent)/(the additives+co-solvent+carbon dioxide), is preferably in the range of from 0.1 to 10 mass percent. When the ratio is smaller than 0.1 percent by mass, in some cases, the cleaning effect cannot be exhibited; however, when the ratio exceeds 10 percent by mass, the mixture becomes, rather than a supercritical fluid, a fluid close to liquid in its properties and unfavorable deterioration of properties such as excellent penetrating power that supercritical carbon dioxide has occurs. The ratio of a total amount of the additives and co-solvent is preferably 5 or less mass percent, and most preferably in the range of from 1 to 2 percent by mass. Furthermore, a ratio of an amount of the additives to a total amount of the additives and co-solvent in the mixture fluid that is set at 100 mass percent, that is, (additives)/(additives+ co-solvent), is preferably in the range of from 0.1 to 5 percent by mass, and most preferably in the range of from 1 to 2 percent by mass.

As mentioned above, by making an amount of the additives is made smaller relative to that of carbon dioxide and co-solvent, processing cost can be reduced consequently. Furthermore, since many additives are strong basic or toxic compounds, the reduction of an amount of exhaustion of the additives contributes to environment and safety problem, and shortens a processing period of time necessary for the subsequent rinse processing.

From a mixture fluid of supercritical carbon dioxide, the additives, the co-solvent and the unnecessary materials, by use of, for instance, a gas-liquid separator or the like, carbon dioxide is vaporized and taken out as a gaseous component, and other components may be separated as a liquid component (solid may be partially contained); furthermore, as needs arise, various kinds of post processing appropriate for the respective components may be applied.

A fourth stage includes the process of obtaining a first rinse fluid from the co-solvent and carbon dioxide and the process of a first rinsing. After the high-pressure processing such as the cleaning in the third stage has come to completion, the high-pressure valve 13 is closed; the pump 12 is stopped; instead, the high-pressure valve 19 is opened; and thereby the co-solvent is guided by use of the pump 18 from the co-solvent tank 17 to the merging point 14 and merged to carbon dioxide there. By use of the mixing unit 15 and the heater 16, a first rinse fluid made of supercritical carbon dioxide and co-solvent is obtained.

While supplying the first rinse fluid, similarly to the third stage by controlling the high-pressure valve 5, to the high-pressure processing chamber 2, a high-pressure fluid in the high-pressure processing chamber 2 is continuously exhausted by an amount substantially same as the supply amount. The first rinse processing takes normally 0.5 to 2 minutes.

According to the fourth stage, clean supercritical carbon dioxide therein the co-solvent is dissolved flows continuously through the inside of the high-pressure processing chamber 2, and, while rinsing a surface of the workpiece 3, removes the contaminated high-pressure fluid generated in the third stage to the outside of the high-pressure processing chamber 2. The unnecessary (contaminated) substances and the additives that are normally low in the solubility into supercritical carbon dioxide are dissolved in carbon dioxide by the help of the co-solvent. Accordingly, when only supercritical carbon dioxide is flowed in the first rinsing process, there is concern in that the unnecessary substances and the additives precipitate and stick again to a surface of the workpiece 3. Accordingly, it is necessary that, after the processing such as the cleaning is carried out, the first rinse fluid in which the co-solvent is dissolved in supercritical carbon dioxide, that is, the first rinse fluid that can dissolve the unnecessary substances and the additives is flowed, and thereby the unnecessary substances and the additives are removed from the high-pressure processing chamber 2.

In a subsequent fifth stage, the second rinsing is carried out. The second rinse fluid is made of supercritical carbon dioxide alone. When the supercritical carbon dioxide is flowed through the high-pressure processing chamber 2, the co-solvent remaining in the high-pressure processing chamber 2 is completely removed, and thereby the cleaning and rinsing of the workpiece 3 come to completion.

Specifically, after the completion of the first rinsing in the fourth stage, the high-pressure valve 19 is closed, the pump 18 is stopped, the high-pressure valve 10 is opened, and carbon dioxide, under pressure by means of a pump 7, is heated with a heater 8 and supplied to the high-pressure processing chamber 2. Similarly to the above third and fourth stages, the high-pressure valve 5 is controlled so that the supply amount and the exhaust amount may become same, and thereby an internal pressure of the high-pressure processing chamber 2 is kept constant. The second rinsing normally takes substantially 0.5 to 2 minutes.

A sixth stage is depressurizing. The pump 7 is stopped, while stopping the supply of carbon dioxide to the high-pressure processing chamber 2, carbon dioxide inside of the high-pressure processing chamber 2 is exhausted through the high-pressure valve 5, and thereby a pressure inside of the high-pressure processing chamber 2 returns to atmospheric pressure. Also in the depressurizing, a temperature in the high-pressure processing chamber 2 is preferably maintained at a predetermined temperature by use of temperature control means 4. When the high-pressure processing chamber 2 is heated, carbon dioxide remaining therein, with a decrease in the pressure, changes from the supercritical state without going through a liquid state to a gaseous state and vaporizes; accordingly, the trouble that is caused during the drying when water is used as a base of cleaning liquid is not at all caused; that is, stain or the like is not generated on a surface of the workpiece 3, and furthermore, fine patterns are not destroyed.

Before applying the sixth stage, as needs arise, the third through fifth stages may be repeated, and thereafter the sixth stage may be performed. It is because when each of the periods of time of the third through fifth stages is shortened and repeated, a whole processing time can be shortened in some cases. It can be appropriately selected according to shapes or situations of the workpiece 3.

In a final seventh stage, the tightly sealed high-pressure vessel 1 is opened, and the workpiece 3 is taken out. Thereby, all stages and all processing come to completion.

In the above, the high-pressure processing method according to the invention has been explained with reference to FIG. 1; however, adding means known to industry segments and changing and applying the invention in the range that does not deviate from the scope of the invention are all included in the invention.

In the following, the invention will be detailed with an embodiment; however, the invention is not restricted to the following embodiment.

Embodiment

With a high-pressure equipment shown in FIG. 1, the inside of a high-pressure processing chamber 2 was heated to 40 degree centigrade by use of temperature control means 4 (heater). A high-pressure vessel 1 was opened, a semiconductor wafer 3 was loaded, the high-pressure vessel 1 was hermetically sealed, and an internal temperature of the high-pressure processing chamber 2 and a temperature of the semiconductor wafer 3 were kept at 40 degree centigrade. After a high-pressure valve 5 was set so as to maintain a pressure at 15 MPa, high-pressure valves 9 and 10 were opened, and liquid carbon dioxide was introduced from a liquid carbon dioxide cylinder 6 to the high-pressure processing chamber 2 until a pressure same as that of the cylinder was attained. Then, a pressure pump 7 was operated, and carbon dioxide was introduced at a flow rate of 10 g/min until a pressure inside of the high-pressure processing chamber 2 became 15 MPa.

In the next place, the high-pressure valve 9 was closed; a high-pressure valve 13 was opened; and, from a storage tank 11 of a mixture of additives and co-solvent, with a pump 12, the additives and co-solvent were allowed to merge into carbon dioxide. In the storage tank 11, a mixture containing in a ratio of 0.1 mass percent of ammonium fluoride and 0.9 mass percent of polypropylene glycol as additives and 99 mass percent of ethanol as a co-solvent was reserved. A flow rate of the mixture was set at 0.4 g/min. Accordingly, a ratio of a total amount of the additives and the co-solvent in a cleaning fluid (additives and co-solvent and carbon dioxide) supplied into the high-pressure processing chamber 2 was 3.8 percent.

One minute after the additives and the co-solvent were supplied, the high-pressure valve 13 was closed; the pump 12 was stopped; instead, the high-pressure valve 19 was opened; a pump 18 was operated; thereby ethanol from an ethanol storage tank 17 was allowed to merge into carbon dioxide; and thereby the first rinsing was carried out.

One minute after the start of ethanol supply, the high-pressure valve 19 was closed, and the pump 18 was stopped.

Furthermore, the high-pressure valve 10 was opened, the semiconductor wafer 3 was rinsed with carbon dioxide alone, and thereby the second rinsing was carried out. After one minute, the high-pressure valve 9 was dosed and the pump 6 was stopped. A pressure setting of the high-pressure valve 5 was controlled, and thereby the high-pressure processing chamber 2 was gradually depressurized to atmospheric pressure. Finally, the high-pressure vessel 1 was opened, and the semiconductor wafer 3 was taken out.

Figure 2:
FIG. 2 is a scanning electron micrograph of a surface of a semiconductor device before cleaning in an embodiment.
Figure 3:
FIG. 3 is a scanning electron micrograph of a surface of a semiconductor device after cleaning in an embodiment.

Scanning electron micrographs of the semiconductor wafer 3 before and after the cleaning are shown in FIGS. 2 and 3, respectively. It can be seen that fine stains in the surroundings of the via holes were removed owing to the cleaning.

INDUSTRIAL APPLICABILITY

In the high-pressure processing according to the invention, the high-pressure processing such as the cleaning and the first and second rinsing are performed under the same pressure; accordingly, there is no loss time between the respective processes, resulting in performing the whole process in a short period of time. Furthermore, the high-pressure processing can be performed stably, uniformly and with reproducibility. Accordingly, the present invention method can be preferably applied as a cleaning method of semiconductor substrates with the supercritical carbon dioxide, or as development and drying methods.

What is claimed is:

1. A processing method for removing an unnecessary substance on a surface of a workpiece by bringing the surface of the workpiece into contact with supercritical carbon dioxide and additives in a pressurized processing chamber, said method comprising:

sealing said processing chamber after loading said workpiece in said processing chamber;

pressurizing said processing chamber with a first predetermined amount of pressurized carbon dioxide supplied to said processing chamber to a predetermined pressure and a predetermined temperature higher than a critical pressure and a critical temperature thereof respectively to form supercritical carbon dioxide in the processing chamber;

dissolving said additives and a co-solvent in a second predetermined amount of the supercritical carbon dioxide by mixing said additives and said co-solvent with said supercritical carbon dioxide in an upstream portion of said processing chamber to form a pressurized fluid mixture thereof;

removing an unnecessary substance on said workpiece while maintaining an interior pressure of said processing chamber higher than the critical pressure and the critical temperature of carbon dioxide, by supplying continuously a third predetermined amount of said pressurized fluid mixture to said processing chamber and removing from said processing chamber a substantially equal amount of a reacted pressurized fluid containing a dissolved amount of the unnecessary substance in the pressurized fluid mixture obtaining a first rinse fluid in which said co-solvent is dissolved in said supercritical carbon dioxide by stopping feed of said additives and mixing said co-solvent with said supercritical carbon dioxide in the upstream portion of said processing chamber;

performing a first rinsing process for replacing the reacted pressurized fluid mixture in said processing chamber with said first rinse fluid while maintaining the interior pressure of said processing chamber higher than the critical pressure and the critical temperature of carbon dioxide, by supplying continuously said first rinse fluid to said processing chamber and removing from said processing chamber a substantially equal amount of the reacted pressurized fluid mixture to that of the first rinse fluid added;

performing a second rinsing process for replacing said first rinse fluid in said processing chamber with said supercritical carbon dioxide as a second rinse fluid while maintaining the interior pressure of said processing chamber higher than the critical pressure and the critical temperature of carbon dioxide, by stopping supply of said co-solvent, supplying continuously only supercritical carbon dioxide to said processing chamber and removing from said processing chamber a substantially equal amount of the first rinse fluid to that of the supercritical carbon dioxide added;

stopping feed of carbon dioxide to said processing chamber;

decompressing said processing chamber to atmospheric pressure; and unloading said workpiece from said processing chamber.

2. The method as set forth in claim 1, wherein said co-solvent is an aliphatic alcohol.

3. The method as set forth in claim 1, wherein said co-solvent comprises at least one alcohol selected from a group consisting of aliphatic alcohols having 1 to 3 carbons.

4. The method as set forth in claim 1, wherein said additives contain a fluoride.

5. The method as set forth in claim 1, wherein a ratio of a total amount of said additives and said co-solvent to a combination of said additives, said co-solvent, and said supercritical carbon dioxide is between 0.1 and 10 mass percent.

6. The method as set forth in claim 1, wherein a ratio of a total amount of said additives and said co-solvent to a combination of said additives, said co-solvent, and said supercritical carbon dioxide is between 0.1 and 5 mass percent.

7. The method as set forth in claim 1, wherein at least one of the supplying said pressurized fluid mixture or the supplying said first rinse fluid to said chamber occurs after mixing at least one of the pressurized fluid mixture or the first rinse fluid mechanically.

8. The method as set forth in claim 1, wherein at least one of the supplying said pressurized fluid mixture or the supplying said first rinse fluid to said chamber occurs after mixing at least one of the pressurized fluid mixture or the first rinse fluid and heating.

9. The method as set forth in claim 1, wherein said workpiece is a semiconductor workpiece.

10. The method as set forth in claim 1, wherein one of said additives comprises at least one of ammonium fluoride, quaternary fluoride, and poly alcohol.

11. The method as set forth in claim 1, wherein one of said additives comprises a basic compound.

12. The method as set forth in claim 4, wherein said fluoride is a compound that contains a nitrogen atom and a hydrogen atom.

* * * * *

UNITED STATES PATENT AND TRADEMARK OFFICE
CERTIFICATE OF CORRECTION

PATENT NO. : 6,962,161 B2
DATED : November 8, 2005
INVENTOR(S) : Inoue et al.

It is certified that error appears in the above-identified patent and that said Letters Patent is hereby corrected as shown below:

<u>Title page,</u>
Item [73], Assignee, should read -- Kabushiki Kaisha Kobe Seiko Sho (Kobe Steel, Ltd.) Kobe (JP) --.

Signed and Sealed this

Tenth Day of January, 2006

JON W. DUDAS
*Director of the United States Patent and Trademark Office*